(12) United States Patent
Wood et al.

(10) Patent No.: US 11,710,584 B2
(45) Date of Patent: Jul. 25, 2023

(54) ABOVE ROOM TEMPERATURE TYPE II SUPERCONDUCTOR

(71) Applicants: John A. Wood, Bethlehem, PA (US); Paul J. Lilly, Howey In The Hills, FL (US)

(72) Inventors: John A. Wood, Bethlehem, PA (US); Paul J. Lilly, Howey In The Hills, FL (US)

(73) Assignee: Taj Quantum, Howey in the Hills, FL (US)

( * ) Notice: Subject to any disclaimer, the term of this patent is extended or adjusted under 35 U.S.C. 154(b) by 386 days.

(21) Appl. No.: 17/249,094

(22) Filed: Feb. 19, 2021

(65) Prior Publication Data

US 2021/0398714 A1 Dec. 23, 2021

Related U.S. Application Data

(60) Provisional application No. 62/979,520, filed on Feb. 21, 2020.

(51) Int. Cl.
*H01B 12/00* (2006.01)
*H01B 12/08* (2006.01)
*H10N 60/85* (2023.01)

(52) U.S. Cl.
CPC ............ *H01B 12/08* (2013.01); *H10N 60/85* (2023.02)

(58) Field of Classification Search
CPC ................................ H01B 12/08; H10N 60/85
See application file for complete search history.

(56) References Cited

U.S. PATENT DOCUMENTS

| 3,447,913 | A | * | 6/1969 | Yntema | H10N 60/20 428/614 |
| 4,008,079 | A | * | 2/1977 | Bowers | H10N 60/85 505/805 |
| 6,036,889 | A | | 3/2000 | Kydd | |
| 6,510,604 | B1 | * | 1/2003 | Pourrahimi | H01F 6/06 29/599 |
| 8,361,321 | B2 | | 1/2013 | Stetson et al. | |

(Continued)

FOREIGN PATENT DOCUMENTS

WO 2010010764 A1 1/2010

OTHER PUBLICATIONS

International Search Report and Written Opinion; PCT/US2021/070173; dated Nov. 16, 2021.

(Continued)

*Primary Examiner* — Pete T Lee
(74) *Attorney, Agent, or Firm* — Dunlap Bennett & Ludwig, PLLC; Anna L. Kinney

(57) ABSTRACT

A Type II superconductor includes a perforated carbonaceous material with an activating material on at least one surface. The activating material a non-polar liquid that does not incorporate Pi-bonding in its structure. The superconductor is manufactured by perforating a carbonaceous material to produce voids and coating at least one surface of the carbonaceous material with the activating material. A superconductive cable includes wires with a perforated carbonaceous material wetted with the activating material on a non-conductive substrate interspersed with non-conducting spacers and surrounded by an insulation layer. The superconductor conducts current at room temperature and above.

16 Claims, 2 Drawing Sheets

(56) References Cited

U.S. PATENT DOCUMENTS

| | | |
|---|---|---|
| 8,795,434 B2 | 8/2014 | Lin |
| 9,567,224 B2 | 2/2017 | Bedworth |
| 9,592,475 B2 | 3/2017 | Stoltenberg et al. |
| 9,610,546 B2 | 4/2017 | Sinton et al. |
| 9,634,222 B2 | 4/2017 | Virtanen et al. |
| 9,744,617 B2 | 8/2017 | Bedworth et al. |
| 2004/0126304 A1 | 7/2004 | Zhao |
| 2006/0249705 A1 | 11/2006 | Wang et al. |
| 2011/0130292 A1 | 6/2011 | Kawashima |
| 2011/0268910 A1 | 11/2011 | Bratkovski et al. |
| 2013/0140058 A1 | 6/2013 | Kim et al. |
| 2015/0337145 A1 | 11/2015 | Torrisi et al. |
| 2018/0251377 A1 | 9/2018 | Derby et al. |
| 2019/0058105 A1 | 2/2019 | Pais |

OTHER PUBLICATIONS

Bruun, G. M. (1998). Type-ii superconductors in high magnetic fields (Master's thesis, Thesis (Ph. D.), 1998). University of Oxford.

Kawashima, Y. (2018). Observation of the Meissner effect at room temperature in single-layer graphene brought into contact with alkanes.

Whangbo, M. H. (2018). Probable cause for the superconductor-like properties of alkane-wetted graphite and single-layer graphene above room temperature under ambient pressure.

\* cited by examiner

ABOVE ROOM TEMPERATURE TYPE II SUPERCONDUCTOR

CROSS-REFERENCE TO RELATED APPLICATION

This application claims the benefit of priority of U.S. provisional application No. 62/979,520, filed Feb. 21, 2020, the contents of which are herein incorporated by reference.

BACKGROUND OF THE INVENTION

The present invention relates to Type II superconductors and, more particularly, to Type II superconductors that operate above room temperature.

Most prior art Type II superconductors require cryogenic temperatures to function, which limits their practical applications. Typical Type II superconductors retain their superconductivity in the presence of strong magnetic fields by the presence of non-conducting/non-superconducting regions or "pores" through which a magnetic field line can penetrate without destroying the superconductivity of the region surrounding the "pore". Those "pores" are normally closely spaced regions (generally around 25 nm in diameter) in the crystal structure of the prior art Type II superconductors. All prior art Type II superconductors that function near or above room temperature are comprised of complex metallic alloys and oxides that tend to be rigid materials, generally having a very complex crystalline structure, which have critical temperatures and critical magnetic fields determined by their chemical composition. These superconductors are not well suited to making flexible wires or very thin (i.e., a few atoms thick) superconducting films. "Type-II Superconductors in High Magnetic Fields" to Georg Morten Bruun at Oxford University is a PhD thesis that goes into great detail on the probable mechanism for how Type II superconductors function but does not mention the possibility of converting a Type I superconductor to a Type II superconductor.

Graphene is used for a variety of purposes. U.S. Pat. No. 8,795,434 B2 to Jaw Tian Lin discloses a method of graphene production. PERFORENE® is a perforated graphene material patented by Lockheed-Martin® for water purification. It is manufactured by creating holes small enough to allow water molecules to penetrate the graphene but not large enough to allow penetration of salts, organic chemicals, or particulate matter. See, for example, U.S. Pat. No. 9,610,546 B2. The manufacturing process is disclosed in U.S. Pat. Nos. 8,361,321 B2, 9,567,224 B2, 9,592,475 B2, and 9,744,617 B2. US Published Patent Application No. 2013/0140058 A1 discloses a method for manufacturing graphene coated metallic wires with improved electrical conductivity, because graphene itself has an electrical conductivity better than silver. None of these publications teaches a superconductor. US Published Patent Application 2011/0268910 A1 to Alexandre M. Bratkovski, et. al. simulates one superconducting feature above room temperature by providing for magnetic shielding but does not provide a true superconductor.

Type I superconductors are limited in the electrical current they can carry because the stronger the current, the stronger the magnetic field the current generates. Once the magnetic field strength reaches a certain threshold, called the critical field, superconductivity is destroyed. The only prior art superconductors that operate as superconductors well above room temperature and which can function as thin films are Type I superconductors comprising graphite or graphene wetted with an aliphatic hydrocarbon. WO2010010764A1 discusses above room temperature Type I superconductivity induced in graphite and graphene by wetting the materials with an aliphatic hydrocarbon. U.S. Pat. No. 9,634,222 discloses a possible above room temperature Type I superconductor made of carbon nanotubes coating a polymeric material with specific functional groups at a specific spacing along the material to induce the formation and transport of Cooper-pairs of electrons. US Published Patent Application US 2004/0126304 A1 to Guomeng Zhao involves the production of carbon nanotubes that become superconducting above room temperature when doped with certain metallic atoms in a specified manner. One high-temperature Type I superconductor has been reported that uses a high-frequency electro-stimulated piezoelectric coating on an insulator. US Published Patent Application No. 2019/0058105 A1 discloses a wire comprised of piezoelectric, metal-coated insulated core that becomes superconducting at room temperature when the wire is vibrated at ultrasonic sound frequencies. None of these references suggests a Type II superconductor.

Recent developments have shown that wetting graphite or graphene with an aliphatic hydrocarbon allows those materials to become Type I superconductors well above room temperature. For example, "Observation of the Meissner effect at room temperature in single-layer graphene brought into contact with alkanes" to Yasushi Kawashima, of the Department of Precision Engineering, School of Engineering, Tokai University, Hiratsuka, Kanagawa 259-1292, Japan, discloses that single layer graphene becomes a room temperature, Type I superconductor when wetted with an aliphatic hydrocarbon. Without being bound by theory, it appears that the aliphatic hydrocarbon liquid dampens the out-of-plane thermal vibrations enough to prevent disrupting the Cooper-pairs (i.e., loosely bound pairs of electrons moving with the same speed with opposite spins) at temperatures well above room temperature. "Probable cause for the superconductor-like properties of alkane-wetted graphite and single-layer graphene above room temperature under ambient pressure" to Myung-Hwan Whangbo addresses a possible explanation for why graphite and graphene become high temperature Type I superconductors at ambient pressure but does not consider the possibility of altering the structure of the graphite or graphene to produce a Type II superconductor. One Type I superconductor required packing graphite powder into a rigid tube and wetting the graphite with liquid aliphatic hydrocarbon to retain superconductivity above room temperature.

As can be seen, there is a need for a thin, flexible superconductor that retains superconductivity well above room temperature in the presence of strong magnetic fields and strong electrical currents.

The present invention provides a class of Type II superconductors comprising perforated graphene wetted on at least one surface with aliphatic hydrocarbon or other suitable activating material, i.e., a non-polar liquid that does not incorporate Pi-bonding in its structure, such as vacuum pump oil, silicone oil comprising methyl silicone, or aliphatic hydrocarbon chains bound to a substrate by one end of the chain comprising a reactive functional group. The inventive superconductors remain superconducting to temperatures (i.e., have a critical temperature) well above room temperature, eliminating the need to maintain cryogenic temperatures. and operate in the presence of strong magnetic fields.

The present invention differs from the entire class of prior art high temperature Type II superconductors in that the inventive superconductors are (1) nonmetallic, (2) highly flexible, (3) may be adjusted through a wide range of critical temperatures and critical magnetic fields by making slight changes during the manufacturing process, and (4) may easily be manufactured as long, continuous strands or wires which may be made into cables with high tensile strength and resistance to stretching and sagging that do not require any cooling. Moreover, the base material does not need to be doped to achieve superconductivity.

The closely spaced nano-scale perforations (non-conducting holes or voids) introduced into the graphene mimic the small, non-conducting regions present naturally in prior art Type II superconductors. The perforations provide fixed locations or regions for selective penetration of magnetic field lines (lines of magnetic force) through the perforated graphene superconductor without disrupting its superconductivity. A Type II superconductor is thereby produced that is superconducting through a wide temperature range, including well above room temperature. Thus, the inventive superconductor tolerates substantial magnetic field strengths without disrupting the superconducting property induced by the aliphatic hydrocarbon or other activating material. The size and distribution of the voids control the critical field of the novel Type II superconductor, providing unprecedented control of the critical field.

The inventive superconductor may be used in compact devices in the home, in the workplace, in medical devices incorporating strong superconducting electromagnets, in aircraft (including lighter than air aircraft), in satellites, in electromagnetic pulse (EMP) protective equipment, and in weapons systems. Additionally, traditional long-distance power transmission lines may be replaced with bundles of high temperature superconducting wires to substantially reduce energy losses over a distance. Superconductive cables are capable of carrying much more current per unit cross-sectional area than copper, so it may be possible to reduce the transmission voltage sufficiently to allow for grounded shielding around the cables, protecting the electrical power grid from natural or artificial EMP. Additionally, since this is a Type II superconductor, the superconducting wires may be used in transformers in the power grid, further reducing energy losses.

Additionally, the novel Type II superconductor appears to be suitable for the production and localization of skyrmions. Therefore, the inventive Type II superconductor is a candidate for super-compact computer memory.

SUMMARY OF THE INVENTION

In one aspect of the present invention, a Type II superconductor is provided, comprising a perforated carbonaceous material and a first activating material, comprising a non-polar liquid that does not incorporate Pi-bonding in its structure, disposed on at least one surface of the perforated carbonaceous material. The Type II superconductor is operative to conduct current at room temperature and above.

In another aspect of the present invention, a superconductive cable is provided, comprising a plurality of wires comprising a non-conductive substrate and a perforated carbonaceous material wetted with an activating material comprising a non-polar liquid that does not incorporate Pi-bonding in its structure disposed around the non-conductive substrate; a plurality of non-conducting spacers interspersed with the plurality of wires; and an insulation layer disposed around the plurality of wires and the plurality of non-conducting spacers.

In another aspect of the present invention, a method of manufacturing a Type II superconductor is provided, comprising: perforating a graphene material to produce voids and coating at least one surface of the graphene material with an activating material comprising a non-polar liquid that does not incorporate Pi-bonding in its structure, wherein the Type II superconductor is operative to conduct current at room temperature and above.

These and other features, aspects and advantages of the present invention will become better understood with reference to the following drawings, description, and claims.

DETAILED DESCRIPTION OF THE INVENTION

Figure 1:
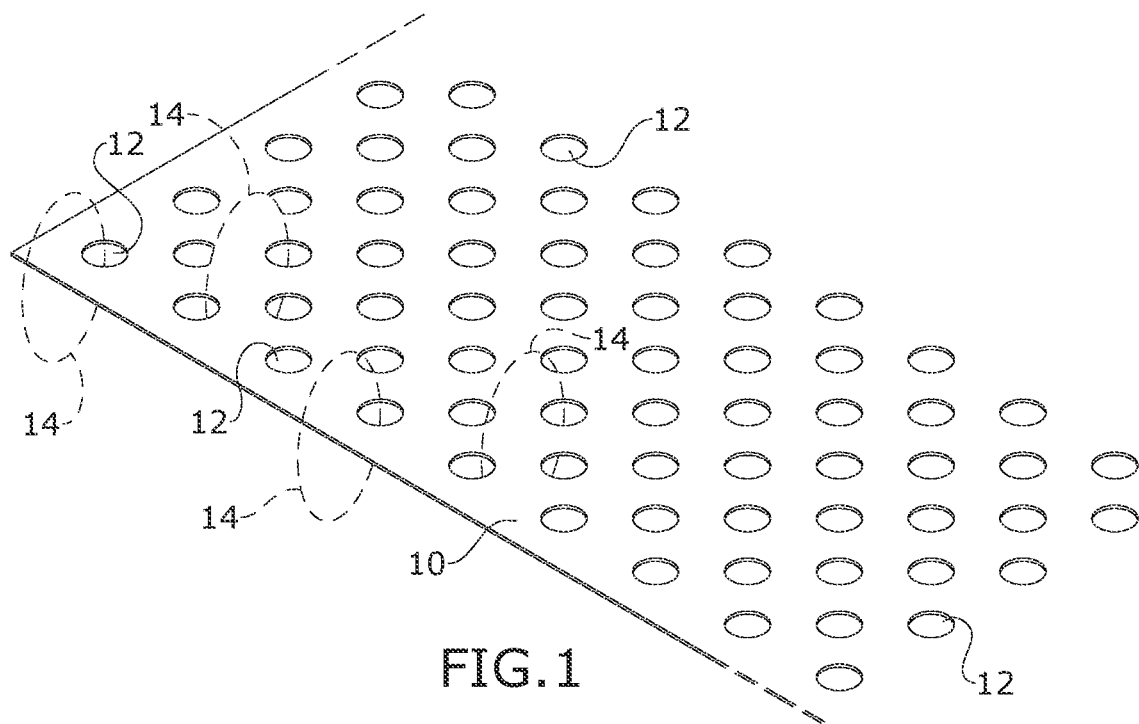
FIG. 1 is a schematic view illustrating perforated graphene according to an embodiment of the present invention.

The following detailed description is of the best currently contemplated modes of carrying out exemplary embodiments of the invention. The description is not to be taken in a limiting sense but is made merely for the purpose of illustrating the general principles of the invention, since the scope of the invention is best defined by the appended claims.

As used herein, the term "graphene" includes all conformations of graphene-like material, whether single- or multi-layered, including sheets, ribbons, spheres, and tubes, including the form commonly known as carbon nanotubes.

"Film" refers to an article having a thickness of up to 10 mils. Generally, the article has a length and/or width greater than the thickness.

"Room temperature" as used herein refers to a temperature of about 20° C.±10° C. The present invention provides a type II superconductor that is operative to conduct current at a wide range of temperatures, from about −100° F. (about −73° C.) to about 302° F. (about 150° C.). Mixtures of aliphatic hydrocarbons remain liquid from very low temperatures (−70 F) to very high temperatures (above 200 F). We expect the intended use to dictate which activating material is selected. For use in arctic conditions, one might select an operating range of −80 F to +120 F (coldest ever reported in Siberia is −96 F), while in very hot climates, one might select activating materials best suited for −10 F to +180 F. I expect the upper temperature limit to be above and the lower limit to be around, although it is unlikely that any specific activating material will cover the entire range.

Broadly, one embodiment of the present invention is a Type II superconductor comprising a perforated carbonaceous material selected from the group consisting of perforated graphene, perforated graphite, a carbonaceous material composed substantially of graphite, and a combination thereof, with an activating material applied thereto. The inventive superconductor is operable within a temperature range dictated by the nature of the activating material selected.

The inventive superconductive material may be used in any place for any purpose prior art Type II superconductors are used without the need for cryogenic temperatures. The invention may be configured to provide flexible, superconducting wires, cables, and films, the latter of which may be only one to a few atoms thick.

The present invention provides a type II superconductor that is operative to conduct current at a wide range of temperatures from about −100° F. (about −73° C.) to about 302° F. (about 150° C.), such as about −80° F. (about −62° C.) to about 120° F. (about 49° C.) or about −10° F. (−23° C.) to about 180° F. (about 82° C.). An inventive superconductive device may operate at a temperature range within which the activating material remains liquid. Therefore, activating materials may be selected depending upon the selected application.

The size and spacing of the perforations and the selection of the specific activating fluid may be preselected to obtain predetermined overall characteristics of the resulting Type II superconductor. For example, the perforations, or voids, may have a predetermined median diameter (such as less than about 30 nm) and a predetermined distribution. PERFORENE®, or some variant, possibly using different density and size of holes, may be used in some embodiments. The hole size and spacing needed for the invention may be different from what is normally used for water purification with PERFORENE®, although the Lockheed-Martin® patented manufacturing methods may produce a hole size and spacing suitable for the novel Type II superconductor. The closely spaced, nano-scale holes in the graphene convert what would normally be a Type I superconductor (i.e., based on a sheet of unperforated graphene) into a Type II superconductor, once an activating material contacts at least one side of the perforated graphene. The activating material may be provided as an outer coating disposed on and/or as an interior layer disposed within the perforated graphene.

The melting point and boiling point of the selected activating material relate to the lower and upper critical temperatures of the inventive Type II superconductor and the size and spacing of the perforations relate to the critical magnetic field of the inventive Type II superconductor and how sharply the critical field occurs, thus allowing unprecedented control of the properties of this novel class of Type II superconductors. For example, a predetermined lower critical temperature and a predetermined upper critical temperature may be used to guide the selection of activating material. If very low vapor pressure activating material is selected, the inventive semiconductor may function in a vacuum for an extended period before the activating material must be refreshed. For example, some vacuum pump oils or vacuum greases may be used.

In some embodiments, the perforations in the layer of carbonaceous material surrounding the internal non-conductive substrate may be made prior to the perforated layer being placed on the inner support.

In some embodiments, the perforations in the layer of carbonaceous material surrounding the internal non-conductive substrate may be made subsequent to the perforated layer being placed on the inner support.

In some embodiments, the activating material may be applied to the inner core support.

In some embodiments, the perforated layer may be placed on the inner support without the activating material applied thereto.

Referring to FIGS. 1 through 4, FIG. 1 shows perforations 12 in wetted graphene 10 providing non-superconducting regions through which a magnetic field 14 may penetrate the superconductor without disrupting superconductivity, thus producing a Type II superconductor. The perforation distribution accommodates the magnetic field.

Figure 2:
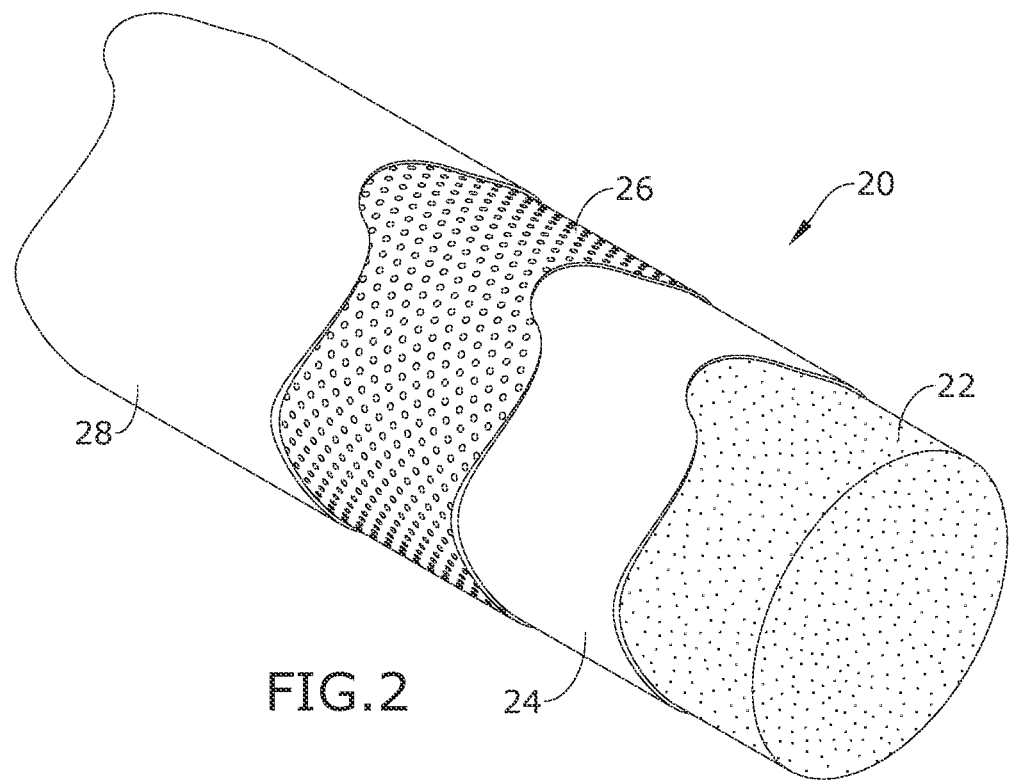
FIG. 2 is a schematic view of a single type II cylindrical superconductor according to an embodiment of the present invention.
Figure 3:
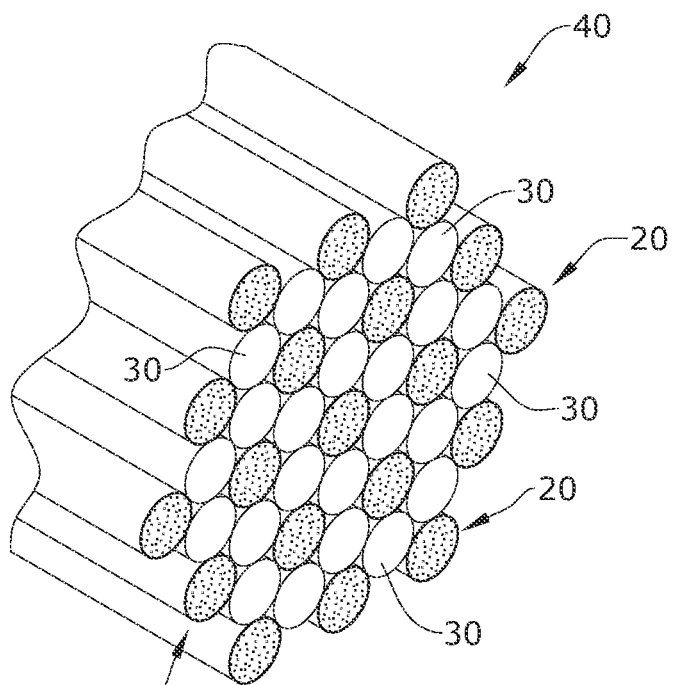
FIG. 3 is a schematic perspective view of an unshielded bundle of superconducting units according to an embodiment of the present invention.
Figure 4:
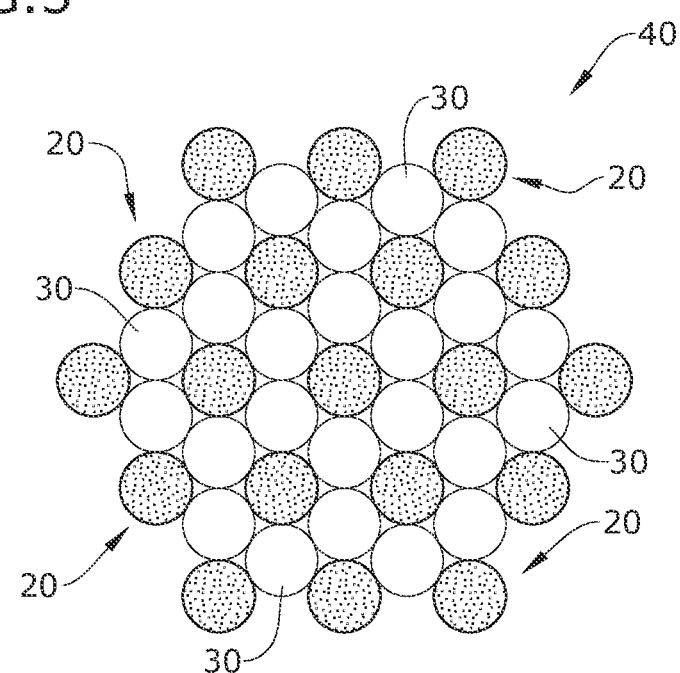
FIG. 4 is a schematic end view thereof.

Since Cooper-pairs tend to migrate to the outer portion (and travel along the exterior) of a superconducting, cylindrical wire, it may be advantageous to form wires as depicted in FIG. 2, which depicts a superconducting unit or wire 20 with a non-conductive core or support 22, coated with a layer of activating material 24, a layer of perforated graphene 26 (e.g., wrapped therearound), and an exterior coat of activating materials 28. FIGS. 3 and 4 show an unshielded bundle 40 of superconducting units 20 interspersed with a plurality of non-conducting spacers 30. The purpose of non-conducting spacers 30 is to sufficiently separate individual superconducting units 20 to minimize the impact of the magnetic field 14 generated by each superconducting unit 20 onto adjacent superconducting units 20, and thus increase the overall critical current, as well as to separate the individual superconducting units 20 from each other electrically to prevent the Cooper-pairs from being repelled from inner conducting units 20 to the outer conducting units 20, which would result in eliminating the inner conducting units 20 from participating in carrying electrical current. If perforated graphene 26 is thicker than a few atoms thick, it may be advantageous to add a second, exterior layer of activating material 28, which may or may not be the same as the first activating material 24 selected for the layer coating the non-conductive core 22.

A layer of insulator (not shown) of predetermined thickness may, in some embodiments, enclose the bundle 40 to prevent leakage of voltage from the unshielded bundle 40 to ground. Further, some embodiments may provide a layer of conducting material (i.e., a conductive layer) on the exterior of the insulation, which may be connected to ground to provide an electromagnetic shield, for example as protection against an EMP.

It should be understood, of course, that the foregoing relates to exemplary embodiments of the invention and that modifications may be made without departing from the spirit and scope of the invention as set forth in the following claims.

What is claimed is:

1. A Type II superconductor, comprising:
   a. a perforated carbonaceous material, comprising a perforated graphene, a perforated graphite, and/or a perforated carbonaceous material composed substantially of graphite; and
   b. a first activating material, comprising a non-polar liquid that does not incorporate Pi-bonding in its structure, disposed on at least one surface of the perforated carbonaceous material;
   wherein the Type II superconductor is operative to conduct current at room temperature and above.

2. The Type II superconductor of claim 1, wherein the perforated carbonaceous material has perforations with a predetermined median diameter less than about 1 µm.

3. The Type II superconductor of claim 1, wherein the perforated carbonaceous material has perforations with a predetermined distribution effective to accommodate a magnetic field without disrupting superconductivity.

4. The Type II superconductor of claim 1, wherein the non-polar liquid that does not incorporate Pi-bonding in its structure is selected from the group consisting of: an aliphatic hydrocarbon, vacuum pump oil, silicone oil comprising methyl silicone, aliphatic hydrocarbon chains bound to a substrate by one end of the chain comprising a reactive functional group, and a combination thereof.

5. The Type II superconductor of claim 1, wherein the first activating material is selected as a function of predetermined lower and upper critical temperatures for the Type II superconductor.

6. The Type II superconductor of claim 1, wherein the first activating material is disposed on the perforated carbonaceous material as at least one of a coating and a layer.

7. The Type II superconductor of claim 1, further comprising a non-conductive substrate, wherein the perforated carbonaceous material is disposed on the non-conductive substrate.

8. The Type II superconductor of claim 1, wherein the Type II superconductor is a film.

9. The Type II superconductor of claim 1, wherein the Type II superconductor is configured as a wire with a layer of the perforated carbonaceous material disposed around a non-conductive core coated with the first activating material.

10. The Type II superconductor of claim 1, wherein the Type II superconductor is configured as a cable comprising a bundle of a plurality of wires interspersed with a plurality of non-conducting spacers, wherein the wires have with a layer of the perforated carbonaceous material disposed around a non-conductive core coated with the first activating material.

11. The Type II superconductor of claim 10, further comprising an outer coating comprising a second activating material, wherein the second activating material is selected from the group consisting of: the first activating material and an other activating material.

12. The Type II superconductor of claim 11, further comprising an insulation layer disposed around the bundle.

13. The Type II superconductor of claim 12, further comprising a conductive layer disposed around the insulation layer.

14. A superconductive cable comprising:
   a. a plurality of wires comprising:
      i. a non-conductive substrate; and
      ii. a perforated carbonaceous material, comprising a perforated graphene, a perforated graphite, and/or a perforated carbonaceous material composed substantially of graphite, wetted with an activating material, comprising a non-polar liquid that does not incorporate Pi-bonding in its structure, disposed around the non-conductive substrate;
   b. a plurality of non-conducting spacers interspersed with the plurality of wires; and
   c. an insulation layer disposed around the plurality of wires and the plurality of non-conducting spacers.

15. A method of manufacturing a Type II superconductor, comprising:
   a. perforating a carbonaceous material, comprising a perforated graphene, a perforated graphite, and/or a perforated carbonaceous material composed substantially of graphite, to produce voids; and
   b. coating at least one surface of the graphene material with an activating material comprising a non-polar liquid that does not incorporate Pi-bonding in its structure;
   wherein the Type II superconductor is operative to conduct current at room temperature and above.

16. The method of claim 15, wherein the activating material is selected as a function of predetermined lower and upper critical temperatures for the Type II superconductor.

* * * * *